United States Patent
Yoon et al.

(10) Patent No.: US 7,127,661 B2
(45) Date of Patent: Oct. 24, 2006

(54) METHOD OF CONFIGURING TRANSMISSION IN MOBILE COMMUNICATION SYSTEM

(75) Inventors: Young Woo Yoon, Seoul (KR); Young Jo Lee, Kyonggi-do (KR); Ki Jun Kim, Seoul (KR); Soon Yil Kwon, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 366 days.

(21) Appl. No.: 09/898,040

(22) Filed: Jul. 5, 2001

(65) Prior Publication Data
US 2002/0022468 A1    Feb. 21, 2002

(30) Foreign Application Priority Data
Jul. 5, 2000     (KR) ............................. 2000-38388
Aug. 19, 2000    (KR) ............................. 2000-48083
Nov. 9, 2000     (KR) ............................. 2000-66532

(51) Int. Cl.
*H03M 13/00*   (2006.01)
*H03M 13/03*   (2006.01)

(52) U.S. Cl. ..................... 714/774; 714/790
(58) Field of Classification Search ............... 714/822, 714/774, 790
See application file for complete search history.

(56) References Cited

U.S. PATENT DOCUMENTS 5,907,586 A * 5/1999 Katsuragawa et al. ...... 375/341

6,370,669 B1 * 4/2002 Eroz et al. ................... 714/774

FOREIGN PATENT DOCUMENTS

| EP | 0999648 A2 | 5/2000 |
| WO | WO 00/03486 | 1/2000 |
| WO | WO 00/21234 | 4/2000 |

OTHER PUBLICATIONS

3rd Generation Partnership Project 2 "3GPP2"; Physical Layer Standard for cdma2000 Spread Spectrum System, pp. G-xxxviii & 1-1 - 3-151.
"Physical Layer Standard for cdma 2000 Spread Spectrum Systems," 3GPP2 C.S0002-0 Version 1.0; Jul. 1999 in pdf format on CD ROM.
English version of Office Action issued by the Japanese Patent Office on Jan. 5, 2005.

* cited by examiner

*Primary Examiner*—Joseph Torres
(74) *Attorney, Agent, or Firm*—Fleshner & Kim, LLP (57) ABSTRACT

Method for configuring a transmission chain in a 3GPP2 system for supporting a flexible or variable data rate of an information bitstream in a process for mapping an information bitstream of a data rate on a physical layer, including the steps of (1) channel coding the information bitstreams with bit rates different from each other into turbo codes or convolution codes having a value inverse of 1/coding rate, and (2) repeating coded bitstream when the channel coded bitstream is smaller than a desired interleaving size, and puncturing the coded bitstream when the channel coded bitstream is greater than the desired interleaving size, for matching the channel coded bitstream to the interleaving size.

12 Claims, 6 Drawing Sheets

METHOD OF CONFIGURING TRANSMISSION IN MOBILE COMMUNICATION SYSTEM

BACKGROUND OF THE INVENTION

1. Field of the Invention

The present invention relates to a 3GPP2 system, and more particularly, to a method for configuring a transmission chain in a 3GPP2 system for supporting a flexible or variable data rate of an information bitstream.

2. Background of the Related Art

In general, the 3GPP2 (the 3rd Generation Partnership Part 2) system has two a transmission modes, specifically a flexible data rate mode and a variable data rate mode, besides a regular data rate mode. The regular data rate mode is a transmission mode operative on a fixed chain called a Radio Configuration (RC). The RC represents a kind of transmission chain in which lengths of information data, channel interleaver, and an output bitstream from a channel encoder according to a code rate of channel codes are made the same to form a standard. In this instance, there is a certain standard rule among the size of the channel interleaver, the coding rate of the channel encoder, and the length of a channel Walsh code. That is, once a chip rate to be used is fixed, a number of chips required for one modulated symbol are fixed according to the size of the channel interleaver, which may be defined as a spreading factor. The length of the Walsh code that can subject different channels to code multiplexing is fixed according to the spreading factor. A number of available Walsh codes are proportional to the length of the Walsh code. Therefore, a number of channels a multiplexing channel can accommodate vary with the Walsh code.

Let us suppose lengths of input information bitstreams of the same lengths after being subjected to channel coding process. In this instance, a capability of error correction code for correcting possible errors in the channel becomes stronger, as the coding rate of the channel encoder is lower. That is, the lower the coding rate of the channel encoder, the stronger error correction capability. This permits use of the lower transmission power.

However, use of the channel encoder with a low code rate elongates the output bitstream of the channel encoder, which, in turn, elongates the size of the channel interleaver. This ultimately increases a modulation symbol rate, and reduces a number of chips required for one modulation symbol at a fixed chip rate, and reduce a number of useful Walsh codes. Opposite to this, if a high channel coding rate is applied to input bitstreams of the channel encoder of identical lengths, lengths of output bitstreams of the channel encoder become short even if the error correction capability is low. This decreases the modulation symbol rate, and permits use of a short channel interleaver, to increase a number of available Walsh codes.

From the above description, it is clear that there is a certain trade off between the coding rate of the channel encoder and the Walsh code spacing. The RC is a standardized transmission chain, which is useful when securing the Walsh code spacing is preferable or when a lower transmission power is required, takes such a trade off relation into account. In the 3GPP2 system, there are currently several standardized RCs for 1× system of 1.2288 Mcps chip rates and several standardized RCs for 3× system of 3.686 Mcps chip rates. It should be noted that since the spreading factor has a value in a form raised to the second power, both the input data rate and the size of the interleaver defined in each of the RCs also have forms raised by two times.

Before a channel is formed between a mobile station and a base station, the mobile station and the base station determine the RC to be used and the spreading factor on the RC, i.e., the size of the channel interleaver, through a negotiation for processing a communication matched to the chain. In modes having a transmission chain different from the transmission chain defined in the RC, the flexible data rate mode and the variable data rate mode are used. In the flexible data rate, any data transmission rate other than the standard data transmission rate supported on the RC can be supported. The flexible data rate has been introduced to support an Adaptive Multi-Rate (AMR) codec, one of 3GPP2 speech codec in a 3GPP physical layer. That is, in the case of AMR, data bits not consistent to the standard transmission rate supported on each of the 3GPP2 RC can currently be produced for a 20 ms frame period.

On the other hand, the variable data rate mode has been provided under the following purpose. In the 3GPP2 system, the base station makes transmission scheduling to a forward supplemental channel, when the base station assigns a fixed data transmission rate to the mobile station for a time period by means of a message. However, a channel situation between the base station and the mobile station during the particular time period may be changed, and a system load on the base station may be changed. For example, as the mobile station goes farther from the base station, the channel situation becomes poorer, causing the base station to lack enough transmission power to transmit data to a particular mobile station at the present data transmission rate.

To solve this problem, the base station may stop transmission of data to supplementary channels for the time period. However, such a solution causes delay in data transmission, as well as needless waste of available transmission power and Walsh codes. As an alternative, the base station may make rescheduling of the data transmission rate after a time period has passed. However, this alternative also causes the problem of the time delay and the waste of the Walsh codes. This situation occurs not only in the forward link. The channel situation between the mobile station and the base station may vary with movements of the mobile station in a reverse link, causing lack of transmission power required for sustaining an appropriate quality. Consequently, the variable data rate mode is used to solve such a situation. In the variable transmission rate, the transmission rate is varied with frames depending on situation. That is, if the channel environment is determined to be poor, the base station drops the transmission rate of the supplementary channel, and if the channel environment is determined restored, the base station restores the transmission rate of the supplementary channel. Provided that such a variable data rate mode is applied, the base station can use available power without the frequent re-scheduling.

To support the flexible data rate mode and the variable data rate mode, each of the RCs in the present 3GPP forms a transmission chain using the following methods.

As described before, the size of the channel interleaver used in each RC is fixed according to the spreading factor. Since the spreading factor has a value in a form raised by second power, a ratio of the size of the interleaver fixed according to one spreading factor to the size of the interleaver fixed according to another spreading factor one step lower than the one spreading factor is 1:2, exactly. If the greater spreading factor is represented with 'A' and the smaller spreading factor is represented with 'B', a 1:1 mapping can be established between the spreading factor and the input information bitstream of the channel encoder in each RC. If lengths of the input information bitstreams of the channel encoder are represented with $I_A$ for the spreading factor 'A' and $I_B$ for the spreading factor 'B' respectively, a relation of $I_B=2*I_A$ is established. If the sizes of the channel interleavers to be used are represented with $N_A$ and $N_B$ respectively, a relation of $N_B=2*N_A$ is established.

Figure 1:
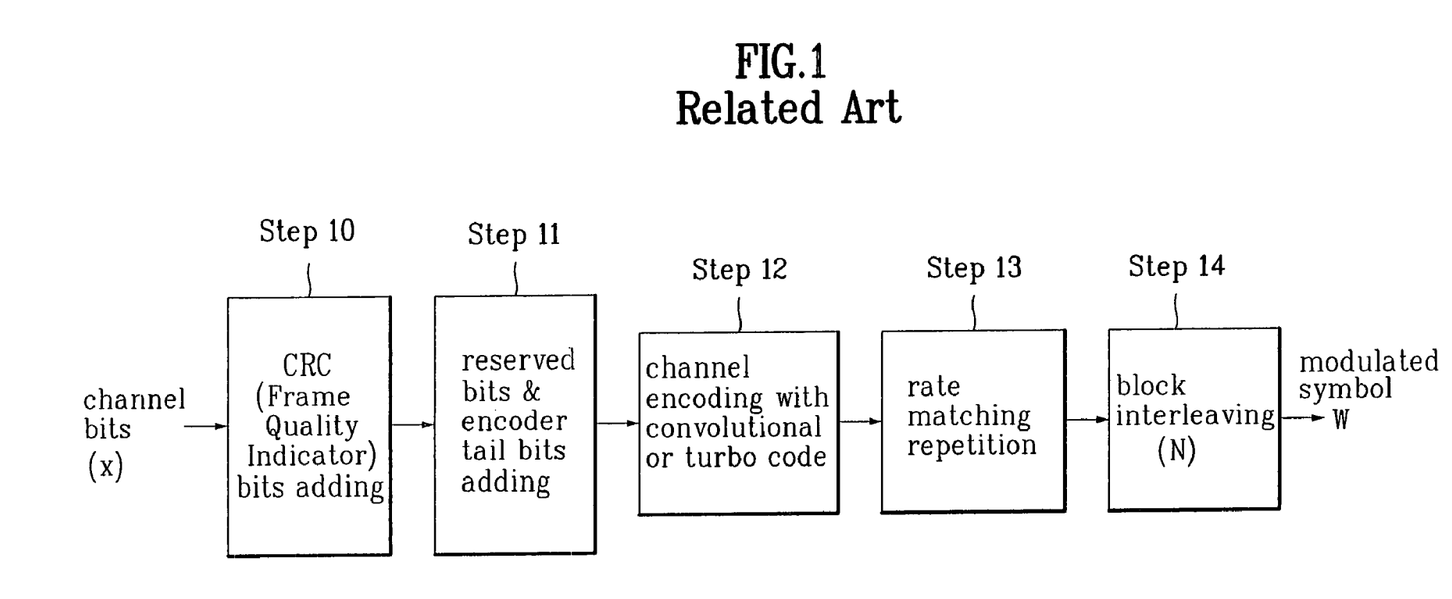
FIG. 1 illustrates a related art Radio Configuration (RC) in a forward link for supporting flexible or variable data rates.

If it is assumed that a coding rate of the channel encoder (using turbo codes or convolution codes) in the RC is 1/n as illustrated in FIG. 1, taking the flexible or variable data rate mode into account, in which 'I' (a length of an information bitstream having CRC bits, tail bits, and reserved bits added thereto in steps 10 and 11) is a length of the input bitstream of the channel encoder, that meets a non-regular data length of "$I_A<I<I_B$," the input 'I' will provide an output "n*I," where "$N_A<n*I<N_B$" is also met (step 12). Consequently, a certain operation for matching the length of the output bitstream of the channel encoder "n*I" to the size of the interleaver is required. A method the 3GPP employs presently is that the length L (=n*I) of the output bitstream of the channel encoder is matched to the interleaver of $N=N_B$ to require a bit repetition as many as "$N_B-n*I$" (step 13) according to the following uniform repetition process. That is, a (k)th output symbol of a repetitive block can be predicted starting from a code symbol of $$\left(\left\lfloor\frac{kL}{N}\right\rfloor\right)th$$

input bitstream for an index k increased from '0' up to 'N−1'.

Next, a method for supporting the variable data rate mode will be described.

In the variable data rate mode, a highest data rate supportable in the initial negotiation process, a data rate one step lower than the highest data rate, and data rate two steps lower than the highest data rate are defined as a transmission data rate set. Accordingly, in the variable data rate mode for the present supplementary channel, the data transmission rate can be adjusted within the supportable highest transmission rate set and the two step lower transmission rate. For the forward channel, the mobile station can only determine a rate variation by means of blind rate detection. Therefore, if a range of a data transmission rate variation is too large, an operative complexity of the mobile station is increased. The sizes of the channel interleaver and the Walsh codes, used in the highest transmission rate, should not be changed. That is, the interleaver and the Walsh codes used in the highest transmission rate presently should not be changed. If the data transmission rate is dropped to a half of the highest transmission rate, two times of symbol repetition is required for matching the size of the interleaver to the length of the output bitstream of the channel encoder. Similarly, if the data transmission rate is dropped to a quarter of the highest transmission rate, four times of symbol repetition is required for matching the size of the interleaver to be used on the channel and the length of the output bitstream of the channel encoder.

The foregoing example is applicable to a case of forward supplementary channel of a non-flexible data rate. The variable data rate mode for the flexible data rate can be supported in the supplementary channel. However, in this case, the definitions of the flexible data rate and the variable data rate mode themselves become vague. That is, even if the highest data rate in the variable data rate mode is a regular rate in the present RC and the one step lower data rate is also a data rate fixed in the present RC, the one step lower data rate can be taken as a flexible data rate that uses no transmission chain fixed in the present RC. This is because the size of interleaver in the variable data rate mode, i.e., the spreading factor, is fixed to that of the highest transmission rate.

As one example, take a RC4 of the present forward channel when the turbo codes or convolution codes of ½ rate is used. It is assumed that the highest transmission rate useable in the variable data rate mode is 76.8 kbps, when the size of the interleaver used in the forward RC4 is fixed at 3072. A variable data rate method in this mode will be discussed. It is assumed that an appropriate value from a set of usable data transmission rates {19.2 kbps, 38.4 kbps, and 76.8 kbps} is used. Though data transmission rates of 19.2 kbps, and 38.4 kbps are the transmission rates defined in the RC4 undoubtedly, a problem lies in that there is no chain that connecting the transmission rates to the 3072, the present interleaver size, in the RC. Therefore, those transmission rates may be taken as the flexible data rates.

Naturally, if the chain has an interleaver size fixed at 'N' even in the variable data rate mode, and the present data transmission rate is not defined in the present RC, the length of output bitstream of the channel encoder and the fixed interleaver size can be matched by means of the aforementioned uniform repetitive algorithm. That is, the flexible data rate and the variable data rate should be treated in a similar manner, and a method for supporting them can be explained with reference to a chain illustrated in FIG. 1.

However, the related art method for supporting the flexible data rate mode and the variable data rate mode makes the concepts of the flexible data rate mode and the variable data rate mode in the existing RC somewhat vague. As explained, the concept of RC may be taken as a kind of standardized rule that defines a relation among the information data rates. However, in the flexible data rate mode, or in the variable data rate mode, the relation can not be established as a standardized rule in the RC. According to this, the size of the interleaver to be used is fixed, channel encoding is carried out according to the coding rate used in the present RC, and the code symbol repetition process is carried out for matching the encoder output with the fixed interleaver size. Thus, in such a flexible data rate mode and variable data rate mode, there is no more standardized relation between the coding rate of the channel encoder and the spreading factor in the RC.

In the related method, as discussed before, the code symbol is repeated for matching the encoder output with a particular spreading factor. It should be noted that 'I/N' and 1/n have the following relation at all data rates except standardized chains in the RC in the flexible data rate mode or in the variable data rate mode, where 'I/N' denotes an effective code rate, 'N' denotes an interleaver size, 'I' denotes the input information bitstream length of the channel encoder, and '1/n' denotes a code rate defined in each RC.

$$I/N<1/n \qquad (1)$$

In other words, equation (1) implies that the effective code rate is dropped in the flexible data rate mode, or the variable data rate mode, and the symbol repetition is used for matching with the interleaver, both of which imply that, though the effective code rate is reduced, an actual code rate is the 1/n defined in the RC as before.

Therefore, both the present flexible data rate mode and the variable data rate mode have a problem of not taking advantage of the coding gain attainable by reducing the coding rate. That is, if the interleaver size is fixed to a certain value, and the transmission rate of the data to be transmitted presently is fixed, it is necessary to select a coding rate that can provide the greatest coding gain according to a relation of the two, and to form a new transmission chain for carrying out a rate matching puncturing or data matching repetition to match the encoder output and the channel interleaver size.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a method for configuring a transmission chain in a 3GPP2 communication system that substantially obviates one or more of the problems due to limitations and disadvantages of the related art.

Another object of the present invention is to provide a method for configuring a transmission chain in a 3GPP2 communication system, in which an information bitstream of non-regular data rate can be mapped to an interleaver size in a flexible or variable data rate transmission mode on a physical layer.

Another object of the present invention is to provide a method for configuring a transmission chain in a 3GPP2 communication system, which introduces a new RC that can support not only a regular data rate, but also flexible or variable data rates.

Another object of the present invention is to provide a method for configuring a transmission chain in a 3GPP2 communication system, in which a spreading factor or a channel interleaver size designated during a call negotiation procedure is fixed, and the code rate is dropped as low as possible in a flexible or variable data rate mode.

Another object of the present invention is to provide a method for configuring a transmission chain in a 3GPP2 communication system, which can provide a maximum performance in matching an output bitstream of a channel encoder to a fixed channel interleaver size.

To achieve at least these objects, in whole or in parts, there is provided a method for configuring a transmission chain in a 3GPP2 system in a process for mapping an information bitstream of a data rate on a physical layer, including the steps of (1) channel coding the information bitstreams with bit rates different from each other into turbo codes or convolution codes with lengths equal to the inverse of 1/coding rate, and (2) repeating the coded bitstream when the channel coded bitstream is smaller than a desired interleaving size, and puncturing the coded bitstream when the channel coded bitstream is greater than the desired interleaving size, for matching the channel coded bitstream to the interleaving size.

To further achieve at least these objects, in whole or in parts, there is provided a method for configuring a transmission chain in a 3GPP2 system in a process for mapping an information bitstream of a data rate on a physical layer, comprising channel coding information bitstreams into one of turbo codes and convolution codes with a length equal to an inverse of 1/coding rate, and at least one of repeating the coded bits of the bitstream when the channel coded bitstream is smaller than a desired interleaving size, and puncturing bits of the coded bitstream when the channel coded bitstream is greater than the desired interleaving size, to match the channel coded bitstream to the interleaving size.

To further achieve at least these objects, in whole or in parts, there is provided a transmission chain for a communication system, comprising an encoder configured to receive a variable rate code stream and/or a flexible rate code stream as an input stream and generate a coded bit stream; a rate matcher, coupled to receive the coded bit stream and match the coded bit stream to a prescribed rate by at least one of puncturing and repeating the coded bit stream; and an interleaver, coupled to receive the punctured bit stream, wherein a rate of the encoder is reduced to a prescribed rate when a rate of the input stream is reduced by a prescribed amount.

To further achieve at least these objects, in whole or in parts, there is provided a turbo encoder for a communication system, comprising a first encoder, coupled to receive an input data bit and generate a first (systematic) data bit and first and second parity bits; and a second encoder to receive the interleaved first data bit and generate an interleaved systematic bit and third and fourth parity bits, wherein the second data bit is eliminated, and the remaining bits are outputted as a coded bitstream, and wherein a rate of the encoder is '$\frac{1}{5}$'.

To further achieve at least these objects, in whole or in parts, there is provided a method of matching a data rate in a communication system, comprising receiving one of a variable rate bitstream and/or a flexible rate bitstream, modifying a rate of an encoder to a prescribed rate to minimize an amount of repetitions and generating an encoded bitstream; and performing one of repetition and puncturing of the encoded bitstream to generate a rate matched bit stream.

To further achieve at least these objects, in whole or in parts, there is provided a communication device capable of matching a data rate in a communication system, comprising means for receiving one of a variable rate bitstream and/or a flexible rate bitstream at a first rate to be encoded; means for modifying a rate of an encoder to a prescribed rate to minimize an amount of repetitions that need to occur in a rematching device and generating an encoded bitstream; and means for performing one of repetition and puncturing of the encoded bitstream to generate a rate matched bit stream.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings. The present invention suggests an Enhanced Rate Adaption Mode (ERAM), which is a channel encoding method that meets a condition that a spreading factor or a channel interleaver size designated in negotiation can make an effective coding rate to be as low as possible under a given channel environment when a communication system is operative in flexible and/or variable data rate modes. Accordingly, the present invention suggests two methods for configuring a new transmission chain in each RC or a new RC which can most effectively support to the flexible and/or variable data rate modes.

First, a method for combining the flexible and the variable data rate modes is suggested for meeting the above condition in an existing RC for configuring a new transmission chain in each RC. Second, a new RC configuring method that supports flexible and/or variable data rates is suggested.

Preferred embodiments of the present invention will be explained with reference to the attached drawings. At first, the first method for supporting the flexible and/or variable data rates in each RC will be explained. If a length of an input information bitstream of a channel encoder defined in a RC is represented with 'I', and a size of a channel interleaver defined for the information bitstream is represented with 'N', a 1-to-1 chain is formed between 'I' and 'N' in a regular data rate mode. However, the 1:1 chain condition is not met in the flexible or variable data rate mode. Consequently, a new chain is requited for connecting the size of a channel interleaver 'N' and the length of input information bitstream of a channel encoder.

First Embodiment

Figure 2:
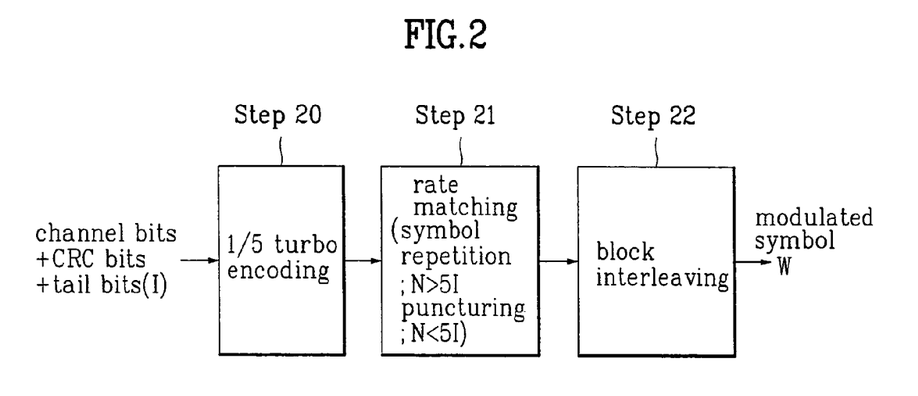
FIG. 2 illustrates a transmission chain of turbo codes for supporting flexible and/or variable data rates in accordance with a preferred embodiment of the present invention.

FIG. 2 illustrates a transmission chain of turbo codes for supporting flexible and variable data rates in accordance with a first preferred embodiment of the present invention.

Referring to FIG. 2, when it is required to form a transmission chain configuration of a data rate different from a regular data rate in each RC, an information bitstream (with a length 'I') of channel bits (or information bits), CRC (Cyclic Redundancy Check) bits which are error detecting bits, and tail bits, is channel encoded by a ⅕ rate turbo encoder (channel encoder) (step 30). An output bitstream of the channel encoder is subjected to rate matching puncturing (5*I>N) or rate matching repetition (5*I<N) to match a length L=5*I of the output bitstream and a size 'N' of the channel interleaver (step 31). The rate matching puncturing or rate matching repetition is made for the whole input information bitstream uniformly.

The foregoing chain can be available because all the turbo codes with ½, ⅓, and ¼ rates used in each RC are formed by puncturing a ⅕ rate turbo code. For example, when the length 'I' of the input information bitstream in a flexible data rate mode in RC4 is 769 bits, the size of the channel interleaver 'N' will be 3072 bits. Accordingly, since the length 'L' of the output bitstream of the channel encoder is 1538 (=769*2), the related art channel configuring requires repetition of the output bitstream as many as (3072–1538) bits for matching with the size 'N'(3072) of the channel interleaver. Consequently, though the effective coding rate is 0.25(769/3072),.the actual coding rate is ½ as before in the related art.

In the transmission chain of the first preferred embodiment, however, 'L' is 3845 (5*769), and requires puncturing as many as (3845–3072) for matching with the channel interleaver size (N=3072). Accordingly, the actual coding rate itself is 0.25(769/3072), which results in coding gain.

As another example, if the length 'I' of the input information bitstream of the channel encoder using turbo codes is 1535, the size of the channel interleaver 'N' is 3072 bits. Since the length 'L' of the output bitstream of the channel encoder is 3070 (1535*2), the related art transmission chain configuration requires repetition of bits as many as (3072–3070) for matching with the channel interleaver size (N=3072). Accordingly, the effective coding rate is 0.5 (1535/3072), which is almost the same as the coding rate used in the RC of the related art transmission chain.

The transmission chain of the present invention has 'L' =7675 (5*1535), and requires puncturing as many as (7675–3072) for matching with the interleaver size N=3072. According to this, the actual coding rate itself is 0.5(1535/3072), to allow a performance identical to the effective coding rate obtainable from the related art transmission chain, because the ½ rate turbo codes are codes obtained by puncturing the ⅕ rate turbo codes. Thus, the transmission chain of the present invention can improve performance in all flexible data rate region.

However, when convolution codes are used, the situation may differ. A forward RC4 is taken as an example. In this case, ¼ rate convolution codes are used in all transmission chains, which are not defined in the RC. As in the previous example, it is assumed that the length of the input information bitstream 'I' of the channel encoder is 769 bits, then the channel interleaver size 'N' is 3072. The related art transmission chain configuration provides the length 'L' of the output bitstream of the channel encoder to be 1538 (769*2), to require repetition as many as (3072–1538) for matching to the channel interleaver size N=3072. According to this, though the effective coding rate 0.25(769/3072), the actual coding rate is still fixed at ½ as before.

However, the transmission chain configuration of the first preferred embodiment provides 'L' 3076 (4*769), which requires puncturing of (3076–3072) for matching to the channel interleaver size N=3072. According to this, the actual coding rate is 0.25(769/3072), which gives an actual coding gain.

As another example, however, if the length 'I' of the input information bitstream of the channel encoder is 1535, the channel interleaver size 'N' is 3072. Accordingly, the related art transmission chain configuration provides 'L' as 3070 (1535*2), which requires repetition of (3072–3070) bits for matching to 'N'. According to this, the effective coding rate is 0.5(1535/3072), so that the actual coding rate is almost the same as in the present RC.

The transmission chain configuration of the first preferred embodiment, however, provides 'L' as 6140 (4*1535), which requires puncturing of(6140–3072) bits to match to the channel interleaver size 'N' (=3072). According to this, the actual coding rate is 0.5(1535/3072). However,in this case, the coding rate is the same as the coding rate obtainable by puncturing approximately 50% of a ¼ rate code. Different from the case of the turbo codes, in the convolutional codes case, since optimal code polynomials for ½ rate, ⅓ rate, and ¼ rate are defined respectively, the transmission chain configuration of the first preferred embodiment may have poorer performance than the same of the related art transmission chain configuration. As a countermeasure for this, the following second embodiment is suggested.

Second Embodiment

The second embodiment suggests a method for configuring a transmission chain of a RC for supporting a flexible or variable data rate mode when the convolutional codes are used instead of the turbo codes in the first embodiment.

First, if it is required to configure a transmission chain of a data rate different from the regular data rate defined in respective RC, a convolution encoder of rate 1/n is employed as the channel encoder, and the rate matching puncturing n*I>N, or the rate matching repetition n*I<N is used for matching the length 'L' (=n*I) of the output bitstream of the channel encoder and the size 'N' of the channel interleaver, when an inverse value of the coding rate 'n' is required to be a value fixed as the following appropriately to provide the best performance according to a relation of 'I' and 'N'.

$$N/I < 2.5 \rightarrow n=2 \quad (2)$$

$$2.5 \leq N/I < 3.5 \rightarrow n=3 \quad (3)$$

$$3.5 \leq N/I \rightarrow n=4 \quad (4)$$

Figure 3:
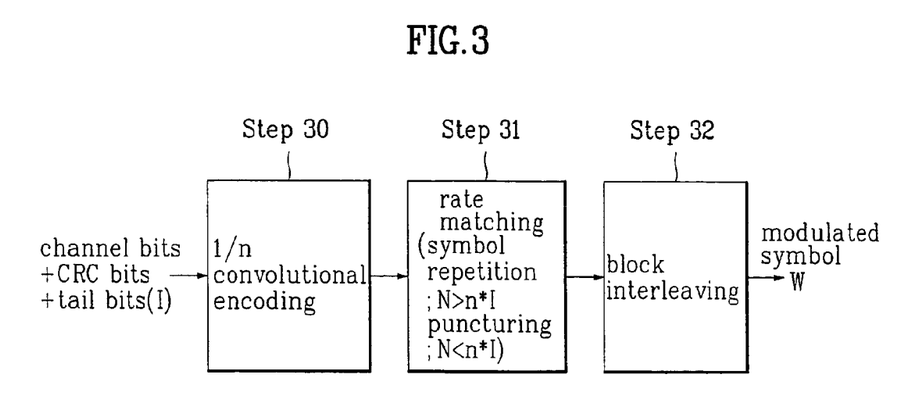
FIG. 3 illustrates a transmission chain of convolution codes for supporting flexible and/or variable data rates in accordance with a preferred embodiment of the present invention.

Second, a method for configuring a transmission chain of convolution codes for flexible and variable data rates is suggested. FIG. 3 illustrates a transmission chain with convolution codes for supporting flexible and variable data rates in accordance with a preferred embodiment of the present invention.

Referring to FIG. 3, if it is required to configure a transmission chain of a data rate different from the regular data rate defined in respective RCs of convolution codes, a convolution encoder of 1/n rate is employed as the channel encoder (step 30). The rate matching puncturing n*I>N or rate matching repetition n*I<N is used for matching between the length 'L' (=n*I) of the output bitstream of the channel encoder and the channel interleaver size 'N' (Step 31). The 'n', an inverse of the coding rate, is a value signaled from the upper layer fixed in the course of negotiation. That is, by adding the inverse of the coding rate to a parameter signaled in the course of negotiation for the related art flexible or variable data rate mode, the transmission chain of convolution codes for flexible data rate and variable data rate can be configured. As in the first embodiment, the rate matching puncturing or rate matching repetition is made for the whole input information bitstream of the channel encoder, uniformly.

As an example, it is assumed that a negotiation for using the flexible data rate mode is carried out in a forward RC4, presently. If the interleaver size 'N' is 3072, and it is 1535, 'n' can be signaled as 2. Through such a signaling, configuration of a transmission chain that has a performance equal to, or better than the present flexible or variable data rate mode is made possible. The aforementioned methods are methods for configuring a new transmission chain for transmission at a flexible data rate and a variable data rate transmission in each RC defined presently. However, a fundamental method is definition of a new RC for supporting the flexible data rate and the variable data rate.

Third Embodiment

Figure 4:
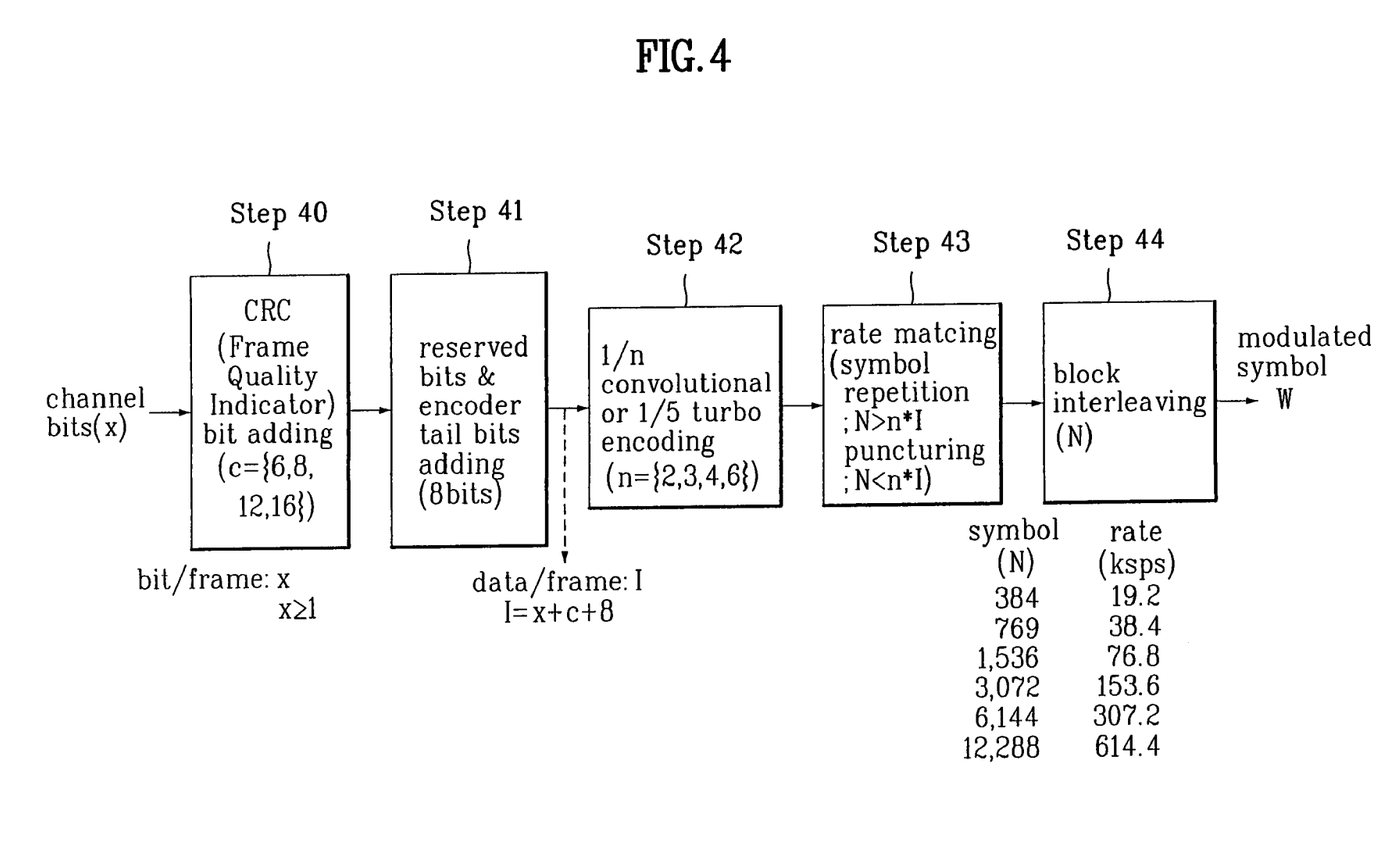
FIG. 4 illustrates a radio configuration in a forward link for supporting a 1× flexible and/or variable data rate in accordance with a preferred embodiment of the present invention.

FIG. 4 illustrates a radio configuration in a forward link for supporting a 1x flexible and variable data rate in accordance with a third embodiment of the present invention. Referring to FIG. 4, a new RC transmission chain is configured as follows.

At a CRC block (step 40), CRC bits with a length selected from {6, 8, 12, and 16} are added to channel bits for error detection. The method for fixing the length of the CRC in the new RC may be signaled between a transmission terminal and a reception terminal at an initial negotiation step. After the CRC bits are added to the channel bits, tail bits or reserved bits are added thereto. Eight tail bits are added thereto if convolutional codes are used, and 6 tail bits and two reserved bits are added thereto when turbo codes are used. At the end, the length of input bitstream of the channel encoder can be defined as I=x+c+8, where 'x' denotes a length of the channel bit, and 'c' denotes a length of CRC (Step 41). The turbo code is defined to be used only in a case the length 'I' of the input bitstream of the channel encoder is greater than 384, and always has a ⅕ coding rate.

In order to use this RC, the following criteria are required to be agreed between the transmission and reception terminals in the initial negotiation step. First, a data rate of information bits to be used and a spreading factor, i.e., the channel interleaver size 'N' must be agreed to. The length of CRC bits intended to be used is required to be agreed, and use of either the turbo codes or the convolution codes is also should be agreed to. If the turbo codes are used, only the ⅕ rate channel encoder is used. On the other hand, if the convolutional codes are to be used, the inverse value 'n' of the coding rate of the convolution codes may be fixed as a value selected from {2, 3, 4, 6} from a ratio between the length 'I' of the input bitstream of the channel encoder and the channel interleaver size 'N', or signaled in the initial negotiation step (Step 42). The performance of the RC defined as thus is the same with the data rate modes in a transmission chain of a regular data rate mode in all existing RC, and equal to, or better than the data rate modes in a transmission chain of the flexible data rate mode and the variable data rate mode.

Fourth Embodiment

Figure 5:
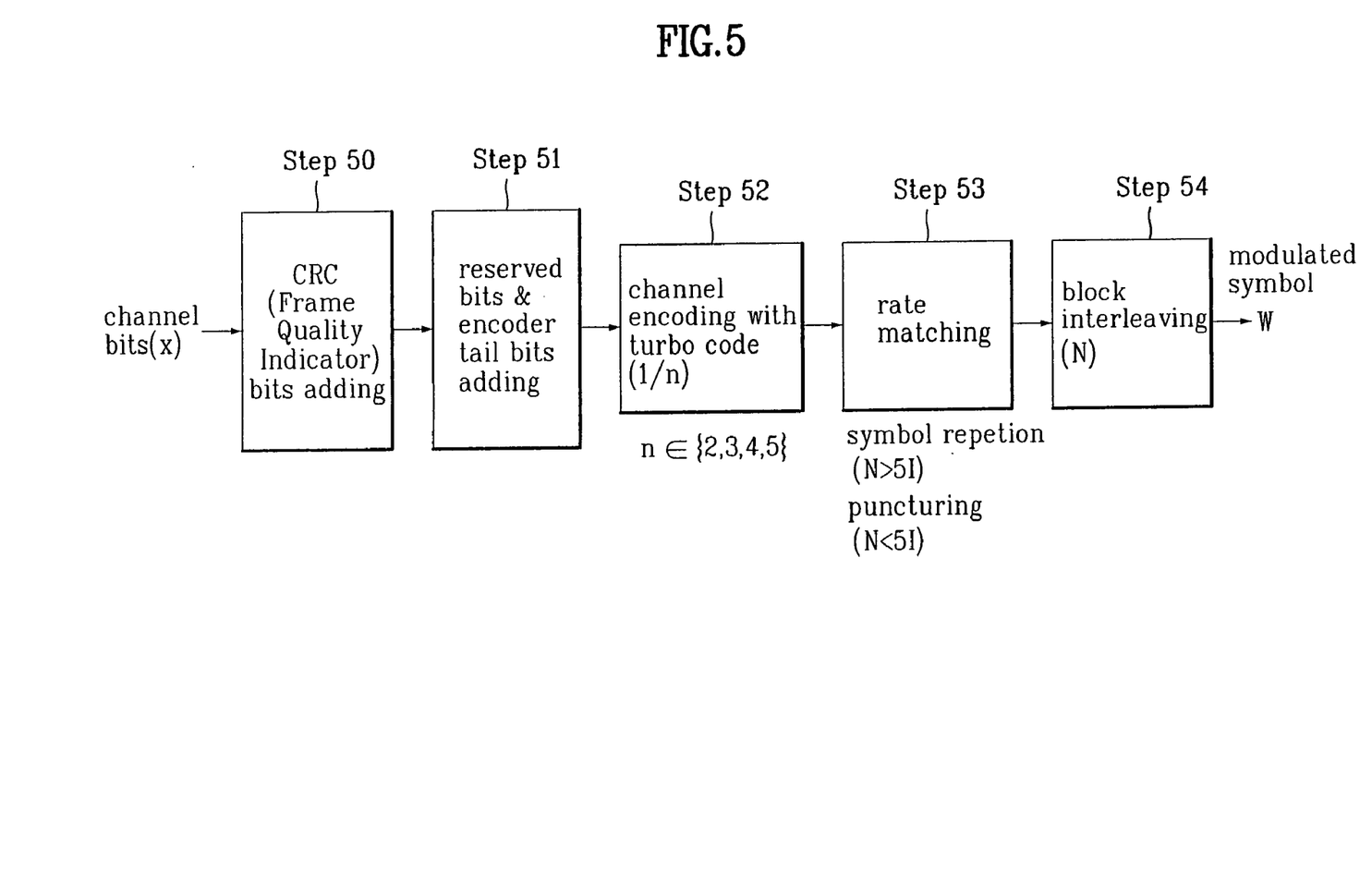
FIG. 5 illustrates a transmission chain of turbo codes for supporting a flexible and/or variable data rate in accordance with a preferred embodiment of the present invention.

The fourth embodiment presents a transmission chain of turbo codes for the flexible data rate or the variable data rate. FIG. 5 illustrates a transmission chain of turbo codes for supporting a flexible or variable data rate in accordance with a preferred embodiment of the present invention. Referring to FIG. 5, an input information bitstream of the channel encoder is generated according to the following process. First, a length of CRC bits is added to channel bits for detection of an error at a CRC bit block (Step 50). In this instance, a method for fixing the CRC length in a new RC can be signaled between a transmission terminal and a reception terminal in an initial negotiation step. After the CRC bits are added to the channel bits, tail bits or reserved bits are added (Step 51). For turbo codes, six tail bits and two reserved bits are added. Then, when it is required to form a transmission chain configuration of a data rate different from the regular data rate defined in a RC by using the turbo codes a 1/n rate turbo encoder may be used as the channel encoder for channel coding (Step 52).

A length 'L=n×I' of the output bitstream of the channel encoder is subjected to rate matching puncturing (5I>N) or rate matching repetition (5I<N), for matching between (n×I) and a channel interleaver size 'N' (Step 53). The 'n', an inverse value of a turbo code rate, is fixed as one selected from {2, 3, 4, 5}. The turbo code rate is fixed according to a ratio between the length 'I' of the input information bitstream of the channel encoder and the channel interleaver size 'N'.

The rate matching repetition for the turbo codes is applicable to a case when the interleaver size is larger than 5I, for which an algorithm that facilitates a uniformity of energy distribution is required. Therefore, it is preferable that the uniform symbol repetition of the related art be employed when the rate matching repetition of the turbo codes is applied. That is, after the rate matching repetition is carried out, prediction of a (k)th output bit in the output bitstream is possible starting from bits of a $$\left(\left\lfloor\frac{kL}{N}\right\rfloor\right)th$$

information bitstream for an index k increased from '0' up to 'N-1'.

For reference, either the rate matching puncturing or the rate matching repetition is applied depending on the relation of '5I' and 'N' in FIG. 5, because a minimum rate of the turbo code usable regardless of the ratio of the 'N' and 'I' is fixed as ⅕. However, since the rate matching puncturing of the turbo codes is required to be carried out under the following basic assumptions, for obtaining a better coding gain even in the condition of 5I<N, the code rate of the channel encoder is fixed according to a ratio of the 'N' and 'I' and a pattern of the rate matching puncturing varies with the code rate. The basic assumption can be summarized as follows.

(1) No puncturing is made at systematic bits (information bits) from two constituent encoders.
(2) A uniform amount of puncturing is made at parity bit output bitstreams from the two constituent encoders.
(3) Puncturing patterns of parity output bitstreams from the constituent encoders are designed to be uniform.

In addition to this, it is preferable that the puncturing pattern according to the newly suggested puncturing algorithm be backward compatible with the puncturing pattern used for the existing regular data rate in view of implementation. Therefore, a new transmission chain is suggested, which facilitates puncturing that meets the above three conditions while the puncturing is interchangeable with the puncturing pattern defined at the existing regular data rate is carried out according to a puncturing pattern to be explained below.

First, the coding rate of the turbo encoder should be fixed according to a relation of 'N' and 'I'. Of course, since all turbo code rates are obtainable by puncturing the ⅕ turbo code rate, it is possible that the coding rate is finally adjusted at a rate matching puncturing terminal after the coding rate of the turbo encoder is fixed at ⅕ turbo code rate. However, since there is a puncturing block in an existing turbo encoder, the puncturing block is used for fixing the code rate appropriately at first according to the relation of 'N' and 'I' in the turbo encoder, and carrying out the rate matching puncturing of a bitstream generated according to the code rate. After the coding rate of the output bitstream of the turbo encoder is fixed by using the puncturing block in the turbo encoder, the length of the output bitstream of the channel encoder having the code rate thus fixed and the interleaver size are matched. If the interleaver size is smaller than 5I, the puncturing is carried out under the following conditions shown in table 1.

TABLE 1

|  | 2I<N≦3I n = 3 | | 3I<N<4I n = 4 | | 4I≦N<5I n = 5 | |
| --- | --- | --- | --- | --- | --- | --- |
| Pattern range | $P_0$ | $P_1$ | $P_0$ | $P_1$ | $P_0$ | $P_1$ |
| Puncturing pattern | 110 | 101 | 1101 | 1101 | 11101 | 11011 |
| Tail puncturing pattern | 101 | 101 | 1011 | 1011 | 11011 | 11011 |

Referring to table 1, when it is required to form a transmission chain configuration of a data rate different from a regular data rate in each RC, an information bitstream (with a length 'I') of channel bits, CRC error bits, and tail bits, is channel encoded by a 1/n rate turbo encoder (channel encoder). The 'n' is an inverse of the code rate of the turbo encoder. The puncturing patterns differ for the following three cases of relations of 'I' and 'N', where 'I' represents the length of information bitstream of the turbo encoder: if 2I<N≦3I, n =3; 3I<N<4I, n=4; and 4I<N<5I, n=5.

Therefore, one information bit in a bitstream, channel coded and forwarded from the 1/n rate turbo encoder, and (n–1) parity bits added to the information bit in a sequence form one unit symbol group, which has a length 'n'.

By way of example, when 'n'=3, the unit symbol group has one information bit, and two parity bits added from the first constituent encoder and the second constituent encoder of the turbo encoder. That is, the unit symbol group has 'n' bits. Accordingly, the unit symbol groups have indices increased from '0' to 'I–1' given thereto and sorted as even numbered groups and odd numbered groups according to even or odd numbers of the indices. The even numbered groups or the odd numbered groups are generally called as a composite code block. Each of the composite code blocks has "⌊I/2⌋=J" unit symbol groups, wherein the even numbered symbol groups include groups with 2j indices, and the odd numbered symbol groups includes with 2j+1 indices, where 'j' denotes indices of the unit symbol groups increased from '0' to J–1. When the output bitstream of the channel encoder has a length 'L', (I–1)th unit symbol group is punctured according to a tail puncturing pattern as shown in table 1. The ⌊I/2⌋=J denotes the greatest integer that is not greater than I/2. Since the length 'L' of the output bitstream of the ½ rate channel encoder has a value of "n×I", a number 'K' of bits to be punctured in each of the even numbered groups and the odd numbered groups can be calculated by $$``\left\lfloor\frac{L-N}{2}\right\rfloor".$$

As the condition set forth before, for making uniform puncturing on the whole output bitstream of the channel encoder and making no puncturing of the first bit in each of unit symbol groups, which is the input information bit of the channel encoder, the present invention employs a puncturing pattern used in a regular data rate as shown in table 1, except a case the interleaver size 'N' is greater than 3I and smaller than 4I when a modified puncturing pattern of a regular data rate is used. Particularly, for making the uniform puncturing of the output bitstream of the channel encoder, the even numbered and odd numbered unit symbol groups to be punctured have indices 'j' satisfying the following inequality (5).

$$(j \times K) \bmod j < K \qquad (5)$$

The inequality (5) predicts the 'j' that facilitates uniform puncturing of a number 'K' of bits to be punctured in each of the composite code blocks (the even numbered groups and the odd numbered groups in the first embodiment) in a 'J' number of unit code symbol groups. Also, the inequality (5) predicts the 'j' for a 'u' number of composite code blocks on a particular 'n' in a fifth embodiment, to be explained later.

Figure 6:
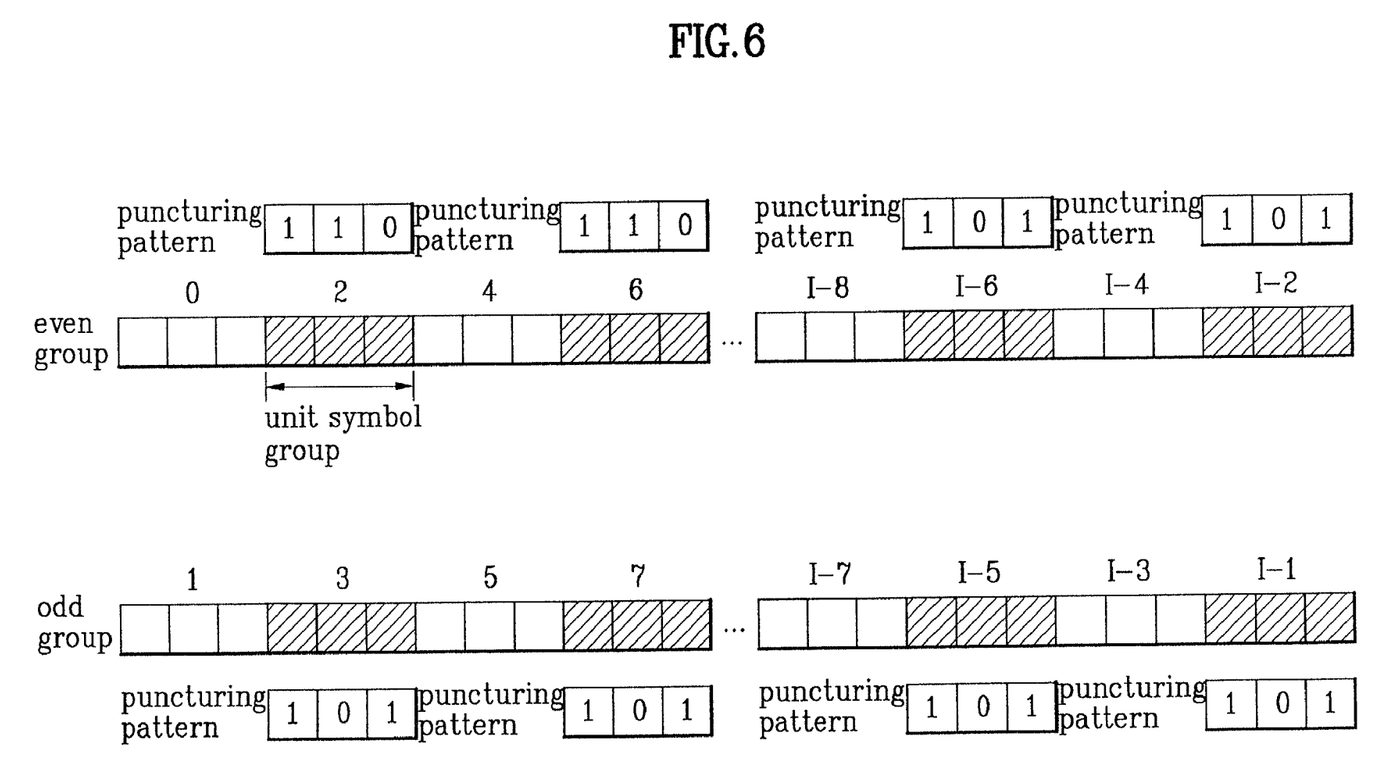
FIG. 6 illustrates an example of puncturing in a transmission chain of turbo codes for supporting flexible and/or variable data rate in accordance with a preferred embodiment of the present invention; and, FIG. 7 illustrates another example of puncturing in a transmission chain of turbo codes for supporting flexible and/or variable data rate in accordance with a preferred embodiment of the present invention.

A puncturing process in accordance with the fourth preferred embodiment of the present invention will be described in greater detail, with reference to FIGS. 6 and 7. FIG. 6 illustrates an example of puncturing in a transmission chain of turbo codes for supporting flexible or variable data rate in accordance with a preferred embodiment of the present invention, and FIG. 7 illustrates another example of puncturing in a transmission chain of turbo codes for supporting flexible or variable data rate in accordance with a preferred embodiment of the present invention.

Figure 7:
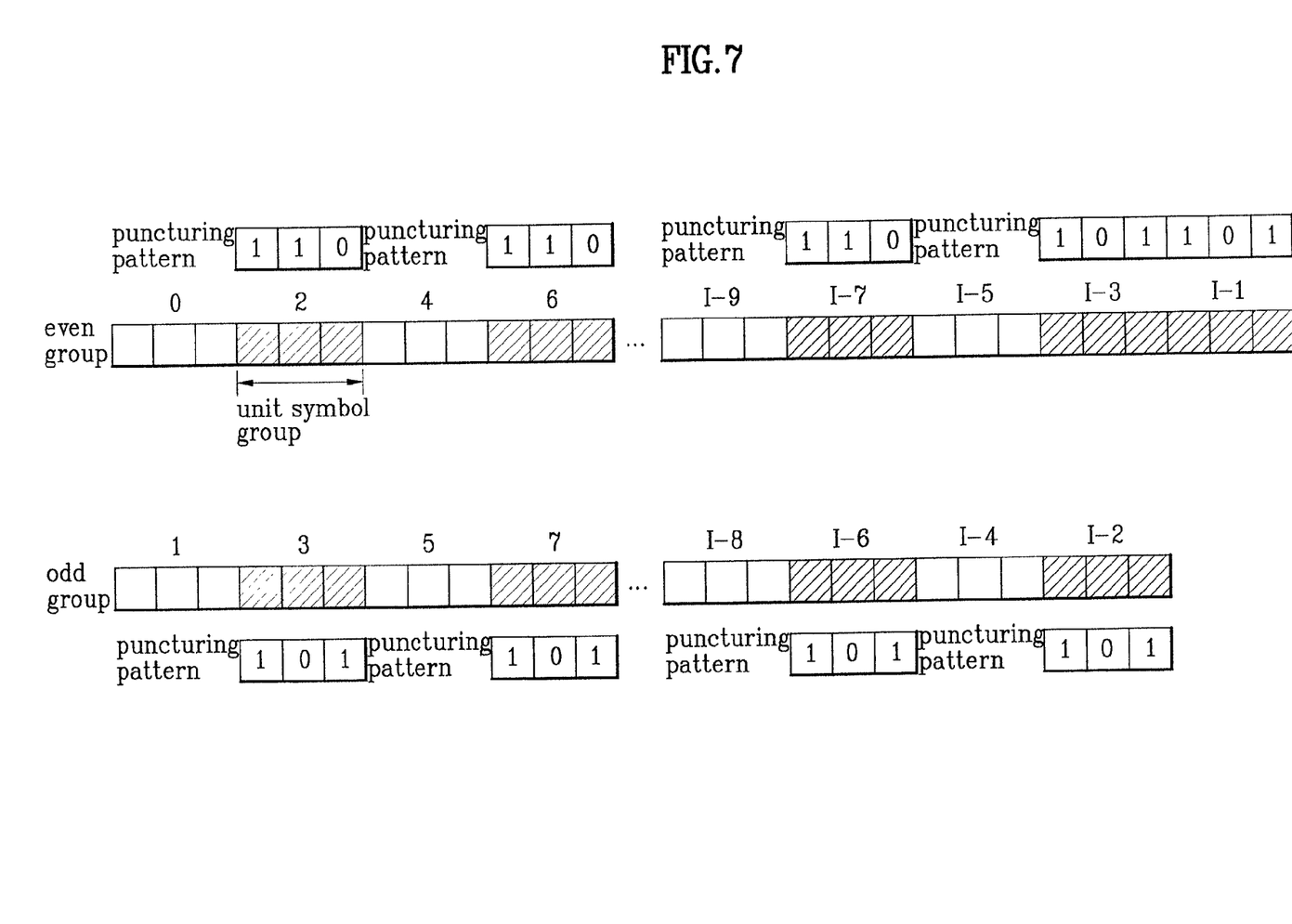

Referring to FIGS. 6 and 7, when the index j satisfies the inequality (5) and the even numbered and the odd numbered unit symbol groups with (2j)th and (2j+1)th indices respectively are defined as a pair relation as shown in FIG. 6, a simultaneous puncturing is made for the unit symbol groups of the pair relation. The hatched parts in FIG. 6 illustrate the punctured unit symbol groups with an index 2j or 2j+1 where 'j' that satisfies the inequality (5). By puncturing bits at different positions, the unit symbol groups of the pair relation are made to have a uniform distribution of the punctured bits.

Particularly, as shown in FIG. 7, when the length of the output bitstream of the channel encoder is an odd number, the even numbered group has one more unit symbol group than the odd numbered group, which is always punctured. In the fourth embodiment of the present invention, an inverse 'n' of the coding rate of the turbo encoder is fixed at first according to a relation of the interleaver size 'N' and the length 'I' of the information bitstream of the channel encoder. Then, a puncturing pattern to be used is defined. The puncturing pattern is a pattern formed based on a puncturing pattern used at an existing data rate. Basically, puncturing or not puncturing in unit symbol groups based on this pattern can make the defined puncturing pattern interchangeable with an existing puncturing pattern of the regular data rate. In this instance, the '2j' and '2j+1' unit symbol groups in the even numbered groups and the odd numbered groups respectively form the puncturing pattern. The punctured unit symbol group pair meets the condition of uniform distribution of punctured bits for parity bits of each constituent encoder.

Fifth Embodiment

The fifth embodiment shows another example of a transmission chain of turbo codes for flexible and/or variable data rate.

TABLE 2

| | 2I<N≦3I, n = 3, p = 2, u = 2 | | 3I<N<4I, n = 4, p = 4, u = 3 | | | 4I≦N<5I, n = 5, p = 2, u = 2 | |
|---|---|---|---|---|---|---|---|
| Pattern range | $P_0$ | $P_1$ | $P_0$ | $P_1$ | $P_2$ | $P_0$ | $P_1$ |
| Puncturing pattern | 110 | 101 | 1101 | 1101 | 1010 | 11101 | 11011 |
| Tail puncturing pattern | 101 | 101 | 1011 | 1011 | 1010 | 11011 | 11011 |

Referring to table 2, when a transmission chain is configured with a data rate different from a regular data rate in each RC, an information bitstream (with a length 'I') of channel bits, CRC error bits, and tail bits, is channel encoded by a 1/n rate turbo encoder (channel encoder). The 'n' is an inverse of the code rate of the turbo encoder. The puncturing patterns differ for the following three cases: if 2I<N≦3I, n=3; if 3I<N<4I, n=4; and if 4I<N≦5I, n=5.

Of the output bitstream of the channel encoder, one information bit and (n−1) parity bits form a unit symbol group having indices from '0' to I−1, wherein unit symbol groups with even numbered indices are sorted as even numbered groups, unit symbol groups with odd numbered indices are sorted as odd numbered groups when n=3 or 5. When n=3 or 5, a parameter 'u' denoting a number of another composite symbol groups formed of the unit symbol groups has a value 2.

However, when n=4, then u=3. That is, the output bitstream from the code rate ¼ channel encoder consists of a plurality of unit symbol groups, the unit symbol group consists of one information bit and three parity bits, and each group of the unit symbol groups with indices each of which yields the same remainder when the index is divided by 3 forms a composite symbol group, to provide three composite symbol groups when u=3. Total 'I' unit symbol groups are formed for a particular 'n', and the composite symbol groups have $$"\left\lfloor \frac{I}{u} \right\rfloor = J"$$

unit symbol groups having indices from uj to u(j+1)−1, where 'j' is a number from 0 to J−1. The $$"\left\lfloor \frac{I}{u} \right\rfloor"$$

is a greatest integer not greater than a value obtained when 'I' is divided by 'u'.

As in the fourth embodiment, when the length 'L' of the output bitstream of the channel encoder is of an odd number, an (I−1)th unit symbol group is punctured according to the tail puncturing pattern as shown in table 2. Each of the composite symbol groups is punctured in pairs, if 'j' satisfies the inequality (5), where unit symbol groups have indices from 'uj' to 'u(j+1)−1'. The unit symbol groups in a pair are punctured according to different puncturing patterns for the same 'n' shown in table 2.

Different from the fourth embodiment, when n=4, a number of bits 'p' to be punctured from an enabled unit symbol group is 4, so that small unit of puncturing made in the pair relation can support a regular data rate puncturing pattern. When n=3 or 5, a number of bits 'p' to be punctured in each of the enabled unit symbol groups in a pair is two. Therefore, a number of bits 'K' to be punctured in each of the composite symbol groups for a particular 'n' can be calculated by $$"\left\lfloor \frac{L-N}{u} \right\rfloor (?)".$$

As in the fourth embodiment, the fifth embodiment makes no puncturing at the first bit as shown in table 2, to prevent puncturing at the information bit as set forth in the forging assumptions, and the puncturing is made at bits each with an index 'j' that satisfies the inequality (5) to provide a uniform distribution of the punctured bits in the whole output bitstream.

In conclusion, the puncturing algorithm of table 2 and the puncturing algorithm in table 1 are different in that the former puncturing algorithm divides the unit symbol groups by a number of unit puncturing patterns in entire puncturing patterns, while the latter puncturing algorithm divides the unit symbol groups into an even numbered group and an odd numbered group. For an example, when the interleaver size 'N' is greater than 3I and equal to, or smaller than 4I, the entire output bitstream of the channel encoder is divided into unit symbol groups each with one information bit and three parity bits added to the information bit in succession. In turn, the unit symbol groups are divided into three composite symbol groups to each of which composite symbol groups the puncturing pattern shown in table 2 is applied.

Sixth Embodiment

The sixth embodiment presents another example of transmission chain of turbo codes for flexible or variable data rate.

TABLE 3

| | 2I<N≦3I, n = 3, p = 2, u = 2 | | 3I<N<4I, n = 4, p = 4, u = 3 | | | 4I≦N<5I, n = 5, p = 2, u = 2 | |
|---|---|---|---|---|---|---|---|
| Pattern range | $P_0$ | $P_1$ | $P_0$ | $P_1$ | $P_2$ | $P_0$ | $P_1$ |
| Puncturing pattern | 110 | 101 | 1101 | 1110 | 1011 | 11101 | 11011 |
| Tail puncturing pattern | 101 | 101 | 1011 | 1011 | 1010 | 11011 | 11011 |

Referring to table 2, when a transmission chain configuration of a data rate different from a regular data rate in each RC is required, an information bitstream (with a length 'I') of channel bits, CRC error bits, and tail bits, is channel encoded by a 1/n rate turbo encoder (channel encoder). The 'n' is an inverse of the code rate of the turbo encoder. The puncturing patterns differ for the following three cases of 'I' and 'N' relations, where 'I' represents the length of information bitstream of the turbo encoder: if 2I<N≦3I, n=3; if 3I<N<4I, n=4; and if 4I<N<5I, n=5.

Of the output bitstream of the channel encoder, one information bit and (n−1) parity bits form a unit symbol group having indices from '0' to 'I−1', wherein unit symbol groups with even numbered indices are sorted as even numbered groups, and unit symbol groups with odd numbered indices are sorted as odd numbered groups when n=3 or 5. When n=3 or 5, a parameter 'u' denoting a number of composite symbol groups formed of the unit symbol groups has a value 2.

However, when n=4, then u=3. That is, the output bitstream from the ¼ code rate channel encoder consists of a plurality of unit symbol groups, the unit symbol group consists of one information bit and three parity bits, and each group of the unit symbol groups with indices each of which yields the same remainder when the index is divided by 3 forms a composite symbol group, to provide three composite symbol groups when u=3. Total 'I' unit symbol groups are formed for a particular 'n', and each of the composite symbol groups has $$"\left\lfloor \frac{I}{u} \right\rfloor = J"$$

unit symbol groups having indices from uj−u(j+1)−1, where 'j' is a number from 0 to J−1. The $$"\left\lfloor \frac{I}{u} \right\rfloor"$$

is a greatest integer not greater than a value obtained when 'I' is divided by 'u'.

The sixth embodiment is different from the fifth embodiment in that a last portion of the unit symbol groups as many as (L mod u) are punctured according to tail puncturing patterns as shown in table 3 depending on a relation of the 'L' of the output bitstream of the channel encoder and 'u'.

Seventh Embodiment

The seventh embodiment presents another example of a transmission chain of turbo codes for flexible data rate and/or variable data rate.

TABLE 4

| | 2I<N≦3I, n = 3, p = 2, u = 2 | | 3I<N<4I, n = 4, p = 4, u = 3 | | | 4I≦N<5I, n = 5, p = 2, u = 2 | |
|---|---|---|---|---|---|---|---|
| Pattern range | $P_0$ | $P_1$ | $P_0$ | $P_1$ | $P_2$ | $P_0$ | $P_1$ |
| Puncturing pattern | 110 | 101 | 1101 | 1111 | 1010 | 11101 | 11011 |
| Tail puncturing pattern | 101 | 101 | 1011 | 1111 | 1010 | 11011 | 11011 |

The sixth embodiment and seventh embodiment have different puncturing patterns when the interleaver size 'N' is greater than 3I and smaller than 4I. Otherwise, the rest are the same with the sixth embodiment. However, if 'L' is not a multiple of 3, additional puncturing is required, applying a slightly different puncturing method thereto. That is, when 'L' is not multiple of 3, the last portion of the unit symbol groups as many as (L mod u), is required to be additionally punctured, when the puncturing pattern is $P_0$ regardless of the unit symbol group. Of course, as suggested, the puncturing method in unit symbol groups is also applicable to a case the code rate of the turbo encoder is always fixed at ⅕, when it is required to define the puncturing pattern such that the puncturing pattern defined in the turbo encoder is also included.

Eighth Embodiment

The Eighth embodiment presents another example of a transmission chain for flexible and/or variable data rate mode as described in table 5.

TABLE 5

| | 2I<N≦3I, n = 3 | | 3I<N<4I, n = 4 | | | 4I≦N<5I, n = 5 | |
|---|---|---|---|---|---|---|---|
| Pattern range | $P_0$ | $P_1$ | $P_0$ | $P_1$ | $P_2$ | $P_0$ | $P_1$ |
| Data Puncturing pattern | 110 | 101 | 1101 | 1110 | 1011 | 11101 | 11011 |
| Tail puncturing pattern | 101 | 101 | 1011 | 1011 | 1010 | 11011 | 11011 |

The fourth embodiment and the eighth embodiment have different puncturing patterns only for the range of 3I<N<4I, where I is the number of information bits per frame including reserved and tail bits, and N is the size of the interleaver. Otherwise the eighth embodiment is the same as the fourth embodiment.

The code symbol groups have indices from i=0 to I−1. Symbol Puncturing is enabled for code symbol Groups with indices 2j and 2j+1, if (j*K) mod J<K is satisfied. Here, J and K are defined as j=⌊I/2⌋ and K=⌊(n* I−N)/2⌋. The pattern used to puncture the code group symbol group i is defined as $P_{(i \bmod 2)}$.

Code symbol groups corresponding to data bit periods of the turbo encoder output are punctured with the data puncturing Pattern. If n*I is odd, the (I−1)th code symbol group is also punctured.

As has been explained, such a method for configuring a transmission chain in a 3GPP2 system has many advantages. For example, the preferred embodiments of the present invention provide a new excellent transmission chain for supporting flexible or variable data rate, by attaining greater coding gain under the assumption that the same spreading factor is used. Also, the preferred embodiments provide a new RC itself for supporting the flexible and variable data rate, which permits to support all data rate in transmission chain standardized in existing all RC without deterioration of performance, and provide an excellent transmission chain by attaining a better coding gain in the flexible and variable data rates.

Moreover, the preferred embodiments can support a transmission chain having a transmission rate higher than a highest transmission rate that can be supported in existing RCs. Since the puncturing pattern of the present invention is interchangeable with the related art puncturing pattern with a regular data rate, the present invention has an advantage in view of implementation. When the flexible data rate mode for the supplemental channel is supported, besides a time diversity gain from the symbol repetition, a coding gain coming from a reduction of an actual code rate can be obtained, that permits to reduce a transmission power.

It is further noted that the methods described above have been adopted by the Third Generation Partnership Project (3GPP2) committee as a standard. The standard is the 3GPP2 document entitled Physical Layer Standard for cdma2000 Spread Spectrum Systems, the entire disclosure of which is incorporated herein by reference.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and got only structural equivalents but also equivalent structures.

What is claimed is:

1. A method of rate adaptation in a communication apparatus, comprising:
   encoding information bits by an encoder at a coding rate, the coding rate being fixed to a specific value among at least two different values using a puncturing block in the encoder according to a ratio of a channel interleaver size and a number of the information bits;
   performing repetition or puncturing of the coded bits for matching a size of the coded bits to the channel interleaver size; and
   interleaving the result of the repetition or puncturing according to the channel interleaver size.

2. The method of claim 1, wherein the at least two different values includes at least two of ½, ⅓, ¼, and ⅕.

3. The method of claim 1, wherein the encoder is a turbo encoder.

4. The method of claim 1, wherein symbol puncturing is enabled for symbol groups having indices 2j and 2j+1 if (j•k) mod J<K, wherein 'I' is a number of information bits per frame, 'J' equals ⌊I/2⌋, 'N' is a size of the interleaver, 'K' equals ⌊(L-N)/2⌋, and 'L' is a number of coded bits, and wherein each of the symbol groups comprises L/I coded bits.

5. The method of claim 4, wherein the information bits include data bits and a pattern used to puncture the symbol group 'i' for the adapted code rate of ⅓ turbo code rate when a prescribed ratio <N >3I is given by $P_{(i \bmod 2)}$, wherein 'i' is an index of the symbol groups and ranges from 0 to I−1, and wherein the pattern to puncture symbol groups corresponding to coded bits of data bits is '110' for $P_0$ and '101' for $P_1$, where '1' indicates no puncturing of the coded bit in the symbol group 'i' and '0' indicates puncturing of the coded bit in the symbol group 'i'.

6. The method of claim 5, wherein the information bits further includes tail bits and a pattern to puncture symbol groups corresponding to coded bits of tail bits is '101' for $P_0$ and '101' for $P_1$.

7. The method of claim 4, wherein the information bits include data bits and a pattern used to puncture the symbol group 'i' for the adapted code rate of ¼ turbo code rate when 3I <N<4I is given by $P_{(i \bmod 2)}$, wherein 'i' is an index of the symbol groups and ranges from 0 to I−1, and wherein the pattern to puncture symbol groups corresponding to coded bits of data bits is '1011' for $P_0$ and '1110' for $P_1$, where '1' indicates no puncturing of the coded bit in the symbol group 'i' and '0' indicates puncturing of the coded bit in the symbol group 'i'.

8. The method of claim 7, wherein the information bits further include tail bits and a pattern to puncture symbol groups corresponding to coded bits of tail bits is '1011' for $P_0$ and '1011' for $P_1$.

9. The method of claim 4, wherein the information bits include data bits and a pattern used to puncture the symbol group 'i' for the adapted code rate of ⅕ turbo code rate when 4I<N<5I is given by $P_{(i \bmod 2)}$, wherein 'i' is an index of the symbol groups and ranges from 0 to I−1, and wherein the pattern to puncture symbol groups corresponding to coded bits of data bits is '11101' for $P_0$ and '11011' for $P_1$, where '1' indicates no puncturing of the coded bit in the symbol group 'i' and '0' indicates puncturing of the coded bit in the symbol group 'i'.

10. The method of claim 9, wherein the information bits further include tail bits and a pattern to puncture symbol groups corresponding to coded bits of tail bits is '11011' for $P_0$ and '11011' for $P_1$.

11. The method of claim 1, wherein the method is implemented during variable data rate mode and/or flexible data rate mode.

12. The method of claim 1, wherein the method is used for radio configuration (RC)4 of a physical channel.

* * * * *